United States Patent
Hartless et al.

(10) Patent No.: US 11,018,783 B2
(45) Date of Patent: May 25, 2021

(54) SYSTEM AND METHOD FOR MITIGATING BROADBAND INTERFERENCE

(71) Applicant: Eagle Technology, LLC, Melbourne, FL (US)

(72) Inventors: Mac L. Hartless, Forest, VA (US); Daniel W. Ericson, Hollis, NH (US); Nathan T. Prosser, Rochester, NY (US); Catherine D. Royster, Lynchburg, VA (US); Dennis Layne, Forest, VA (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 107 days.

(21) Appl. No.: 16/510,650

(22) Filed: Jul. 12, 2019

(65) Prior Publication Data

US 2021/0013977 A1   Jan. 14, 2021

(51) Int. Cl.
*H04B 17/345* (2015.01)
*H04W 24/08* (2009.01)
*H04W 52/24* (2009.01)
*H04W 52/36* (2009.01)
*H04W 72/08* (2009.01)

(52) U.S. Cl.
CPC .......... *H04B 17/345* (2015.01); *H04W 24/08* (2013.01); *H04W 52/243* (2013.01); *H04W 52/36* (2013.01); *H04W 72/082* (2013.01)

(58) Field of Classification Search
CPC .... H04B 17/345; H04B 1/7097; H04B 1/109; H04W 72/082; H04W 52/36; H04W 52/243; H04W 24/08
See application file for complete search history.

(56) References Cited

U.S. PATENT DOCUMENTS

| | | | | |
|---|---|---|---|---|
| 4,761,828 A | * | 8/1988 | Rinderle | H04B 1/1027 455/296 |
| 5,201,062 A | * | 4/1993 | Nakamura | H04B 1/1027 381/10 |
| 5,761,614 A | * | 6/1998 | Leitch | H04B 1/109 455/226.1 |
| 7,292,830 B1 | * | 11/2007 | Cheung | H04B 17/345 375/345 |
| 10,263,719 B2 | | 4/2019 | Gallagher et al. | |

(Continued)

FOREIGN PATENT DOCUMENTS

EP   0600637 A1 * 6/1994 ............... G01S 7/34

*Primary Examiner* — Steven H Nguyen
(74) *Attorney, Agent, or Firm* — Fox Rothschild LLP; Robert J. Sacco; Carol E. Thorstad-Forsyth

(57) ABSTRACT

Systems and methods for operating a communication device so as to mitigate intermodulation interference to a signal. The methods comprise: continuously monitoring several communication channels by the communication device; using a noise floor level estimate of the communication device to detect when the communication device is under an influence of hig interference; determining an optimal level of attenuation to be applied by a variable attenuator of the communication device's receiver so as to mitigate the influence of intermodulation interference to the signal; and selectively adjusting an amount of attenuation being applied by the variable attenuator to achieve the optimal level of attenuation for mitigating intermodulation interference.

16 Claims, 10 Drawing Sheets

(56) References Cited

U.S. PATENT DOCUMENTS

| | | | |
|---|---|---|---|
| 10,264,462 B2 | 4/2019 | Song et al. | |
| 2004/0038656 A1* | 2/2004 | McCall | H04B 1/109 455/138 |
| 2005/0163197 A1* | 7/2005 | Cleary | H03G 3/3078 375/147 |
| 2006/0246917 A1* | 11/2006 | Jin | H04W 16/04 455/450 |
| 2014/0362892 A1* | 12/2014 | Richley | A42B 3/30 375/148 |

* cited by examiner

SYSTEM AND METHOD FOR MITIGATING BROADBAND INTERFERENCE

BACKGROUND

Statement of the Technical Field

The present document concerns communication systems. More particularly, the present document concerns systems and methods for mitigating interference (e.g., broadband and/or narrowband) in receivers.

Description of the Related Art

Conventional radios include Land Mobile Radios ("LMRs"). When LMRs get close to broadband sites operating in neighboring frequency allocations, they experience relatively high levels of the broadband signal as interference. This interference can produce significant intermodulation ("IM") products which may degrade radio performance or sensitivity by raising the noise floor of the receiver. These effects are further aggravated by the high peak to average power ratio characteristics of broadband signals.

SUMMARY

This document concerns systems and methods for operating a communication device so as to mitigate intermodulation interference (e.g., broadband and/or narrowband) to a signal. The methods comprise: continuously monitoring several communication channels by the communication device; using a noise floor level estimate of the communication device to detect when the communication device is under an influence of high interference; determining an optimal level of attenuation to be applied by a variable attenuator of the communication device's receiver so as to mitigate the influence of intermodulation interference due to the interference signal; and selectively adjusting an amount of attenuation being applied by the variable attenuator to achieve the optimal level of attenuation for best receiver performance.

In some scenarios, the methods also comprise: estimating the noise floor level with an original attenuation level being applied by the variable attenuator of the communication device's receiver. The noise floor level is estimated by acquiring a power measurement value for an on channel, a power measurement value for at least one high side channel, and a power measurement value for at least one low side channel. A same or different number of high channel power measurements and low channel power measurements may be acquired. The noise floor level is set equal to a minimum value of the power measurement values acquired for the measured channels over the receiver's analysis bandwidth (e.g., in some scenarios the following channels will be measured as a minimum: the on channel, at least one high side channel, and at least one low side channel will be measured).

In those or other scenarios, a detection is made as to when the communication device is under the influence of a high level of interference based on results from comparing the estimated noise floor level to a threshold value. The threshold value is equal to a known thermal noise floor level plus a certain amount X. The certain amount X variable represents the amount of noise floor increase allowed before a test is performed to determine if the interference is due to intermodulation and the receiver sensitivity can be improved by adding some attenuation before a low noise amplifier to put the receiver in a more linear operating region.

The optimal level of attenuation is determined by: iteratively adding an incremental level of attenuation ($\Delta$ attenuation) and measuring the noise level difference ($\Delta$ noise power) from the previous iteration; calculating a slope that is defined by a change in noise power over a change in attenuation; comparing the slope to a threshold value Y; and considering the optimal level of attenuation to be the previous level of attenuation applied by the variable attenuator when the current slope estimate is less than the threshold value Y.

BRIEF DESCRIPTION OF THE DRAWINGS

This disclosure is facilitated by reference to the following drawing figures, in which like numerals represent like items throughout the figures.

DETAILED DESCRIPTION

Figure 1:
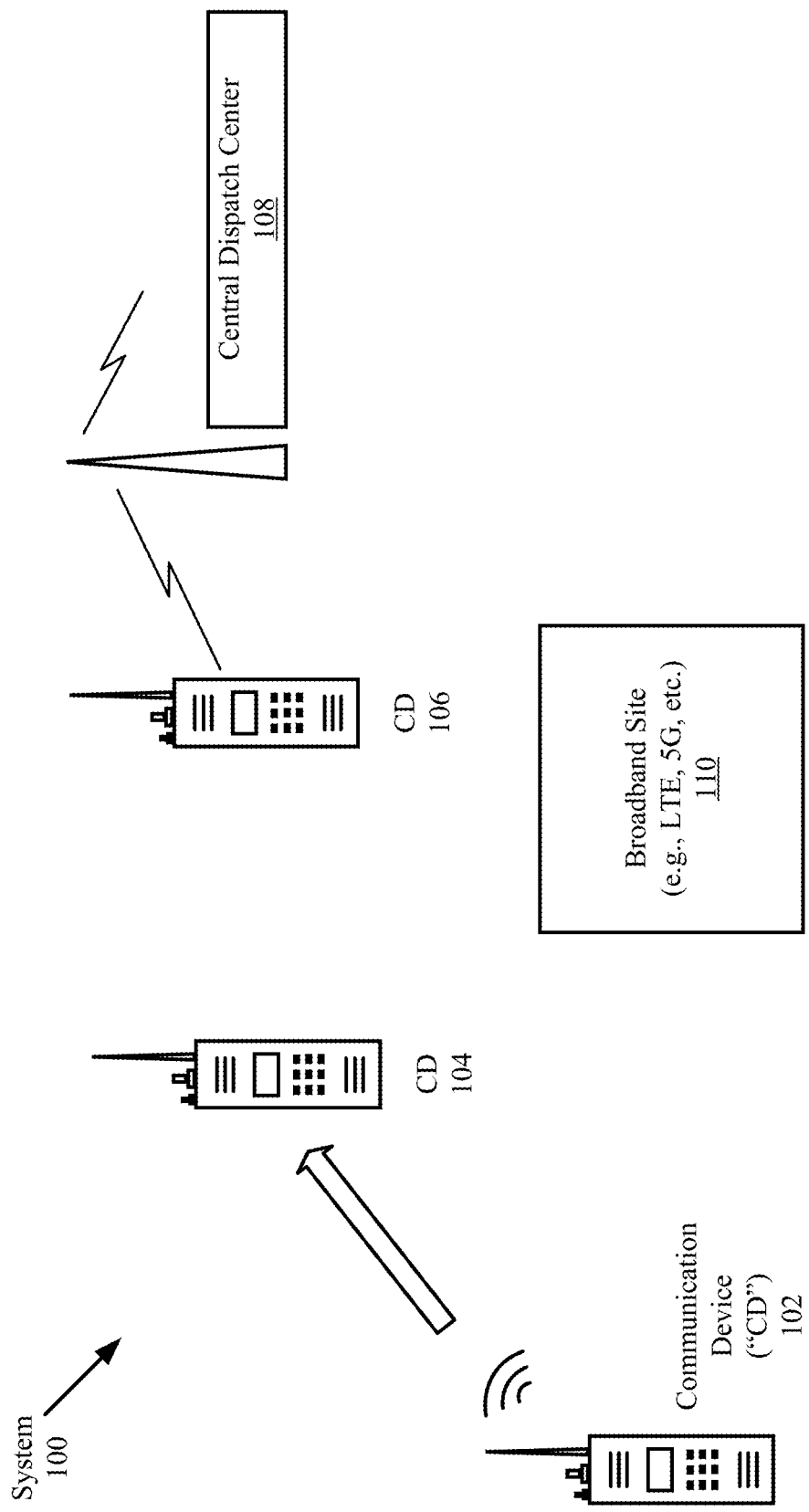
FIG. 1 is an illustration of an illustrative system implementing the present solution.

It will be readily understood that the solution described herein and illustrated in the appended figures could involve a wide variety of different configurations. Thus, the following more detailed description, as represented in the figures, is not intended to limit the scope of the present disclosure, but is merely representative of certain implementations in various different scenarios. While the various aspects are presented in the drawings, the drawings are not necessarily drawn to scale unless specifically indicated.

Reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

This document generally concerns systems and methods for operating a communication device so as to mitigate intermodulation interference (e.g., broadband and/or narrowband) to a receiver. The methods comprise: continuously monitoring a plurality of communication channels by the communication device; using a noise floor level estimate of the communication device to detect when the communication device is under an influence of high interference;

determining an optimal level of attenuation to be applied by a variable attenuator of the communication device's receiver so as to mitigate the influence of intermodulation interference due to the interference signal; and selectively adjusting an amount of attenuation being applied by the variable attenuator to achieve the optimal level of attenuation for best receiver performance in the presence of the interfering signal.

In some scenarios, the methods also comprise: estimating the noise floor level with an original attenuation level being applied by the variable attenuator of the communication device's receiver. The noise floor level is estimated by acquiring a power measurement value for an on channel, a power measurement value for at least one high side channel, and a power measurement value for at least one low side channel. A same or different number of high channel power measurements and low channel power measurements may be acquired. The noise floor level is set equal to a minimum value of the power measurement values acquired for the measured channels (e.g., an on channel, at least one high side channel, and at least one low side channel) over the receiver's analysis bandwidth.

In those or other scenarios, a detection is made as to when the communication device is under the influence of a high level of interference based on results from comparing the noise floor level estimate to a threshold value. The threshold value is equal to a known thermal noise floor level plus a certain amount X. The certain amount X variable represents the amount of noise floor increase that is allowed before an attenuation test is performed to determine if the interference is due to intermodulation and the receiver sensitivity can be improved by adding some attenuation before a low noise amplifier to put the receiver in a more linear operating region.

The optimal level of attenuation is determined by: iteratively adding an incremental level of attenuation ($\Delta$ attenuation) and measuring the noise level difference ($\Delta$ noise power) from a previous iteration; calculating a slope that is defined by a change in noise power over a change in attenuation; comparing the slope to a threshold value Y; and considering the optimal level of attenuation to be the previous level of attenuation (e.g., $\alpha(n-1)$) applied by the variable attenuator when the current slope estimate is less than the threshold value Y.

Referring now to FIG. 1, there is provided an illustration of an illustrative system 100. System 100 comprises a plurality of communication devices 102, 104, 106, a Central Dispatch Center ("CDC") 108, and a broadband site 110. The communication devices 102-106 include, but are not limited to, a portable radio (e.g., an LMR), a fixed radio with a static location, a smart phone, and/or a base station. The broadband site 110 includes, but is not limited to, an LMR site, a 2G cellular site, a 3G cellular site, a 4G cellular site, and/or a 5G cellular site. CDC 108 and broadband site 110 are well known in the art, and therefore will not be described herein.

During operation of system 100, signals are communicated between the communication devices 102-106 and/or between one or more communication devices and the CDC 108. For example, communication device 102 communicates a signal to communication device 104, and CDC 108 communicates a signal to communication device 106. Communication devices 104 and 106 perform operations to mitigate interference caused by the broadband site 110. The interference results because the raised noise floor of received broadband signals (e.g., broadband signal 400 of FIG. 4) causes the noise floor of the communication device to be increased when the signal power is above a certain level. The manner in which communication devices 104 and 106 mitigate the broadband interference to signals will become evident as the discussion progresses.

Figure 2:
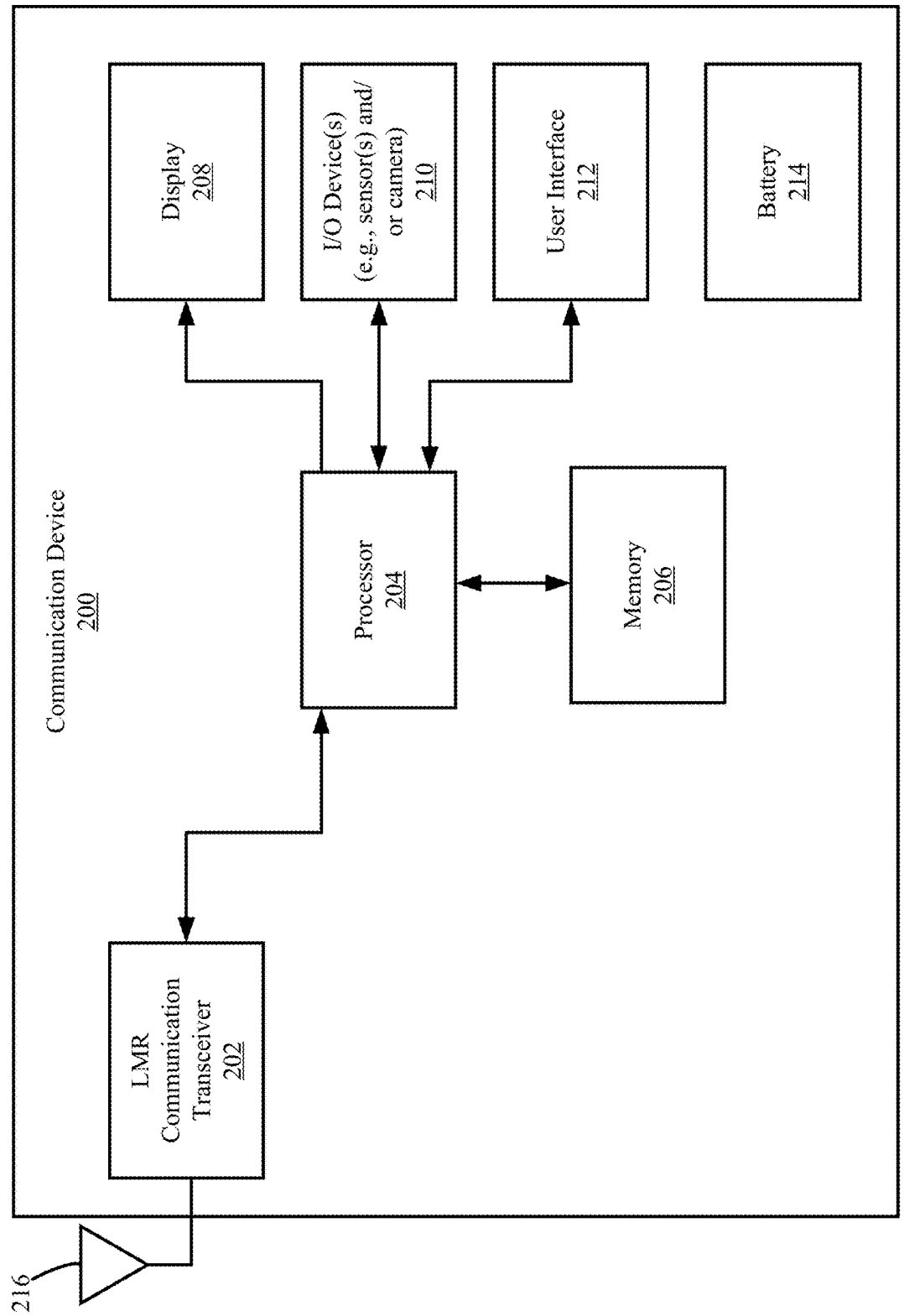
FIG. 2 is an illustration of an illustrative communication device architecture.

Referring now to FIG. 2, there is provided an illustration of an illustrative architecture for a communication device 200 which is configured for carrying out the various methods described herein for mitigating the broadband interference. Communication devices 102-106 are the same as or similar to communication device 200. As such, the discussion provided below in relation to communication device 200 is sufficient for understanding communication devices 102-106. Communication device 200 can include more or less components than that shown in FIG. 2 in accordance with a given application. For example, communication device 200 can include one or both components 208 and 210. The present solution is not limited in this regard.

As shown in FIG. 2, the communication device 200 comprises an LMR communication transceiver 202 coupled to an antenna 216. The LMR communication transceiver can comprise one or more components such as a processor, an application specific circuit, a programmable logic device, a digital signal processor, or other circuit programmed to perform the functions described herein. The communication transceiver 202 can enable end-to-end LMR communication services in a manner known in the art. In this regard, the communication transceiver can facilitate communication of voice data from the communication device 200 over an LMR network.

Although the communication device 200 has been described herein as comprising an LMR communication transceiver, it should be understood that the solution is not limited in this regard. In some scenarios, the communication network can comprise a cellular communication network instead of an LMR type network. In that case, the communication device 200 could include a cellular network communication transceiver in place of an LMR communication transceiver. In another scenario, the communication device 200 could include both an LMR communication transceiver and a cellular network communication transceiver. In this regard, it should be understood that the solutions described herein can be implemented in an LMR communication network, a cellular communication network, and/or any other communication network where broadband interference by another communication system exists that generates interference energy that may be detected in neighboring channels.

The LMR communication transceiver 202 is connected to a processor 204 comprising an electronic circuit. During operation, the processor 204 is configured to control the LMR communication transceiver 202 for providing LMR services. The processor 204 also facilitates mitigation of interference to signals. The manner in which the processor facilitates interference mitigation will become evident as the discussion progresses.

A memory 206, display 208, user interface 212 and Input/Output ("I/O") device(s) 210 are also connected to the processor 204. The processor 204 may be configured to collect and store data generated by the I/O device(s) 210 and/or external devices (not shown). Data stored in memory 206 can include, but is not limited to, one or more look-up tables or databases which facilitate selection of communication groups or specific communication device. The user interface 212 includes, but is not limited to, a plurality of user depressible buttons that may be used, for example, for entering numerical inputs and selecting various functions of the communication device 200. This portion of the user interface may be configured as a keypad. Additional control buttons and/or rotatable knobs may also be provided with the user interface 212. A battery 214 or other power source may be provided for powering the components of the communication device 200. The battery 200 may comprise a rechargeable and/or replaceable battery. Batteries are well known in the art, and therefore will not be discussed here.

The communication device architecture show in FIG. 2 should be understood to be one possible example of a communication device system which can be used in connection with the various implementations disclosed herein. However, the systems and methods disclosed herein are not limited in this regard and any other suitable communication device system architecture can also be used without limitation. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the illustrative system is applicable to software, firmware, and hardware implementations.

Figure 3:
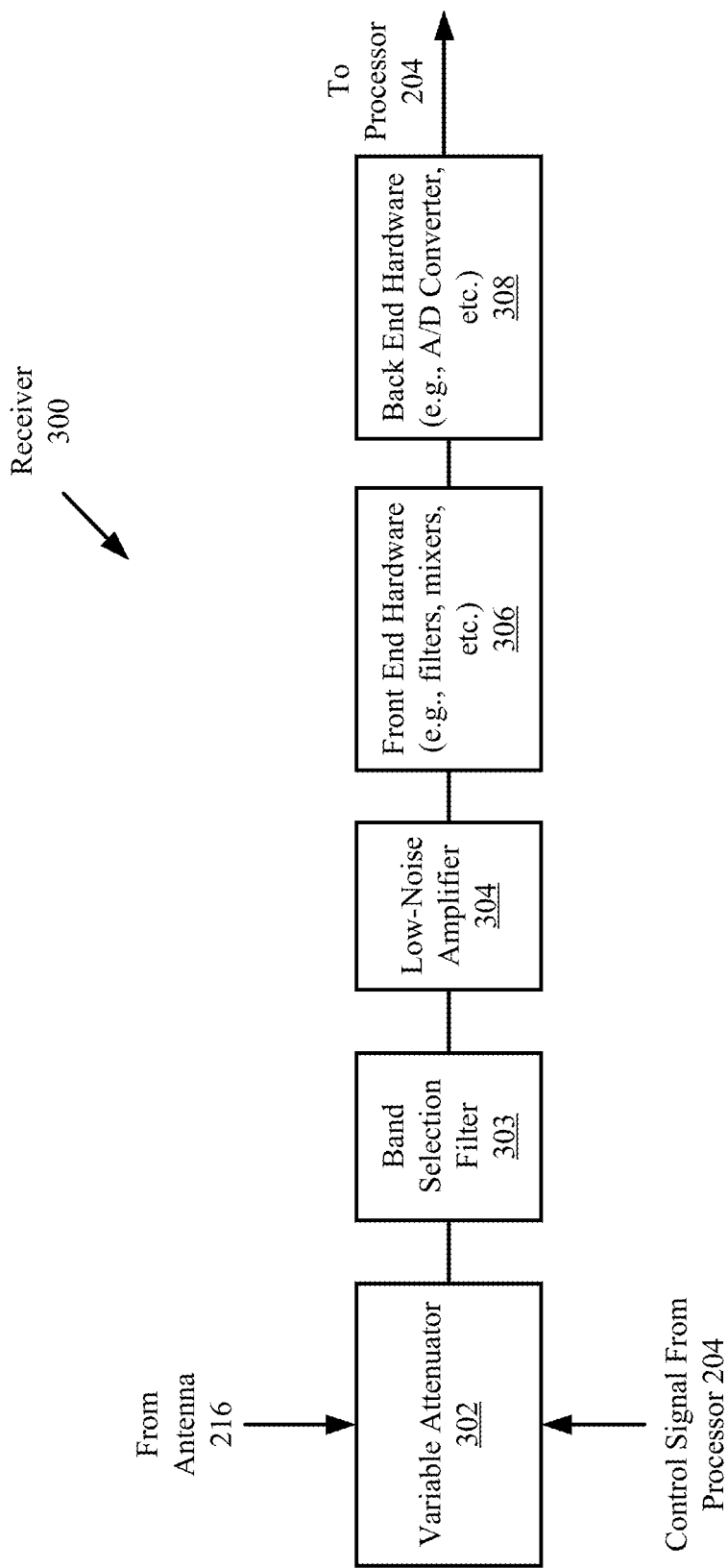
FIG. 3 is an illustration of an illustrative receiver architecture.

Referring now to FIG. 3, there is provided a more detailed illustration of an illustrative receiver portion 300 of the LMR communication transceiver 202. Receiver 300 comprises a variable attenuator 302, a band selection filter 303, a Low-Noise Amplifier ("LNA") 304, front end hardware 306, and back end hardware 308. Each of the listed devices is known in the art, and therefore will not be described herein. Still, it should be noted that the variable attenuator receives signals from the antenna 216 and applies attenuation to the place the receiver 300 in a more linear operating region. The amount of attenuation is controlled by the processor 204 of FIG. 2. The manner in which the attenuation by the variable attenuator 302 is controlled will become evident as the discussion progresses.

Figure 4:
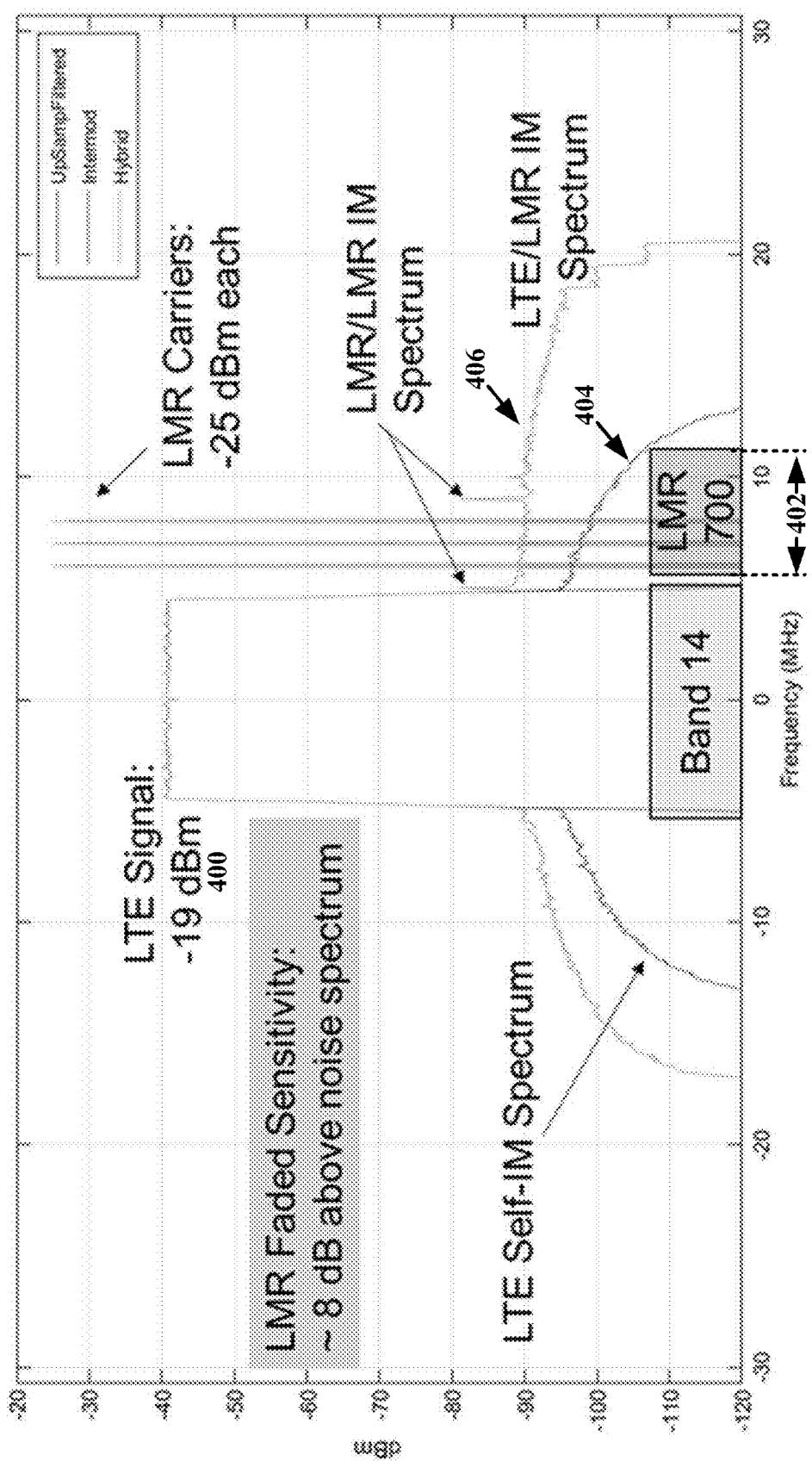
FIG. 4 is a graph that is useful for understanding LTE interference in an LMR band.

Referring now to FIG. 4, there is provided a graph that is useful for understanding how the noise interference is caused by an LTE signal 400 in the LMR band 402. Spectrum 404 represents the relative power of the noise interference that is caused by a spreading of the LTE signal 400 into the LMR band 402. This additional noise that shows up at the receiver's front end degrades the performance of the receiver. Spectrum 406 represents the noise interference when both LMR carriers and the LTE signal 400 are present in the LMR band 402. In this case, there is an even higher interference to signals in the receiver band. This apparent noise exists because of a limitation in a performance of the receiver. If a signal which is higher than the linear operating region of the receiver and causing intermodulation interference is attenuated prior to the receiver's front end, the noise floor drops rapidly. For example, if 1 dB of attenuation is added in the receiver, then the noise floor decreases by 3 dB if the interference is domination by $3^{rd}$ order intermodulation products. Thus, an advantage is obtained by attenuating the signal because the interference generated by intermodulation is more attenuated.

Figure 5:
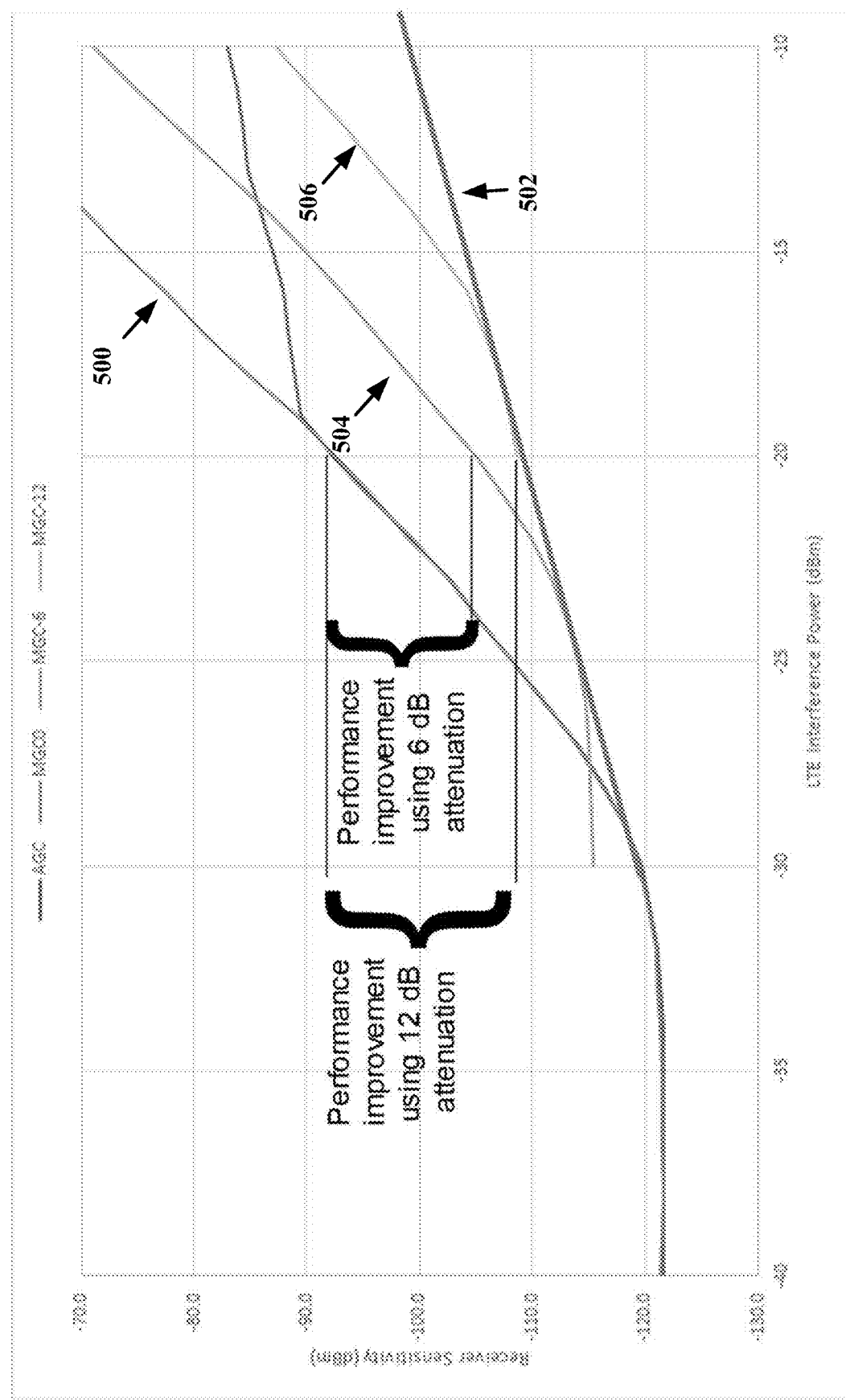
FIG. 5 is a graph that is useful for understanding the present solution.

Referring now to FIG. 5, there is provided a graph showing a current performance of an LMR receiver when no attenuation is applied prior to its front end hardware. The current performance is represented by line 500. Line 500 has a slope of 3:1. The slope is defined as the change in noise power over the change in attenuation (i.e., Δ noise power/Δ attenuation). The 3:1 slope is due to the $3^{rd}$ order IM products caused by an LTE site's signal level placing the communication device receiver in a non-linear operating region. Line 502 represents the desired performance of the LMR receiver with an optimal amount of attenuation added to its front end. Line 502 has a slope of 1:1, which indicates that the LMR receiver is operating in a more linear operating region. Line 504 represents the LMR receiver performance when a 6 dB attenuation is applied to its front end. As can be seen, there is a 12 dB improvement in LMR receiver performance when the 6 dB attenuation is applied to its front end. Line 506 represent the LMR receiver performance when a 12 dB attenuation is applied. As can be seen, there is an 18 dB improvement in LMR receiver performance when the 12 dB attenuation is applied to its front end.

Notably, the attenuation should not be continuously applied at the receiver front end to mitigate the LTE interference because some sensitivity of the receiver would be lost during times when the IM condition does not exit. So, the present solution waits until the measured slope p is less than the threshold parameter Y.

Figure 6:
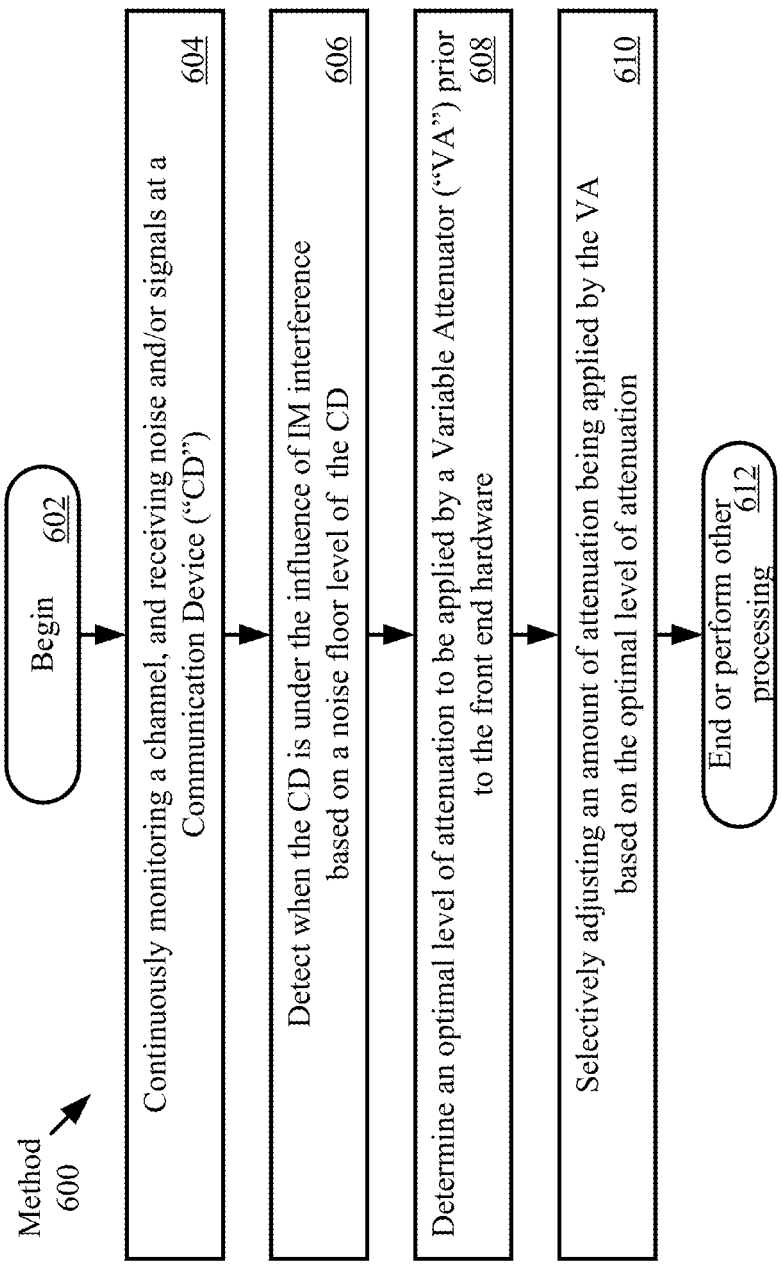
FIG. 6 is a flow diagram of a method for mitigating LTE interference.

Referring now to FIG. 6, there is provided a method 600 for mitigating LTE interference. Method 600 begins with 602 and continues with 604 where a communication device (e.g., communication device 104 or 106 of FIG. 1) performs operations to continuously monitor a communications channel. Methods for monitoring communications channels are well known in the art, and therefore will not be described herein. The communication device also receives noise signals and/or communications signals in 604. Methods for receiving noise signals and communications signals are well known in the art, and therefore will not be described herein.

In 606, the noise floor level of the communication device is used to detect when the communication device is under the influence of IM interference or in an IM limited condition. The manner in which the noise floor level is used here will become more evident as the discussion progresses. If the communication device is under the influence of IM interference, then an optimal level of attenuation that is to be applied by a variable attenuator (e.g., variable attenuator 302 of FIG. 3) is determined as shown by 608. In 610, the amount of attenuation being applied by the variable attenuator is selectively adjusted based on the optimal level of attenuation. For example, the level of attenuation being applied by the variable attenuator is set equal to the optimal level of attenuation. Subsequently, 612 is performed where method 600 ends or other processing is performed (e.g., return to 602).

Figure 7:
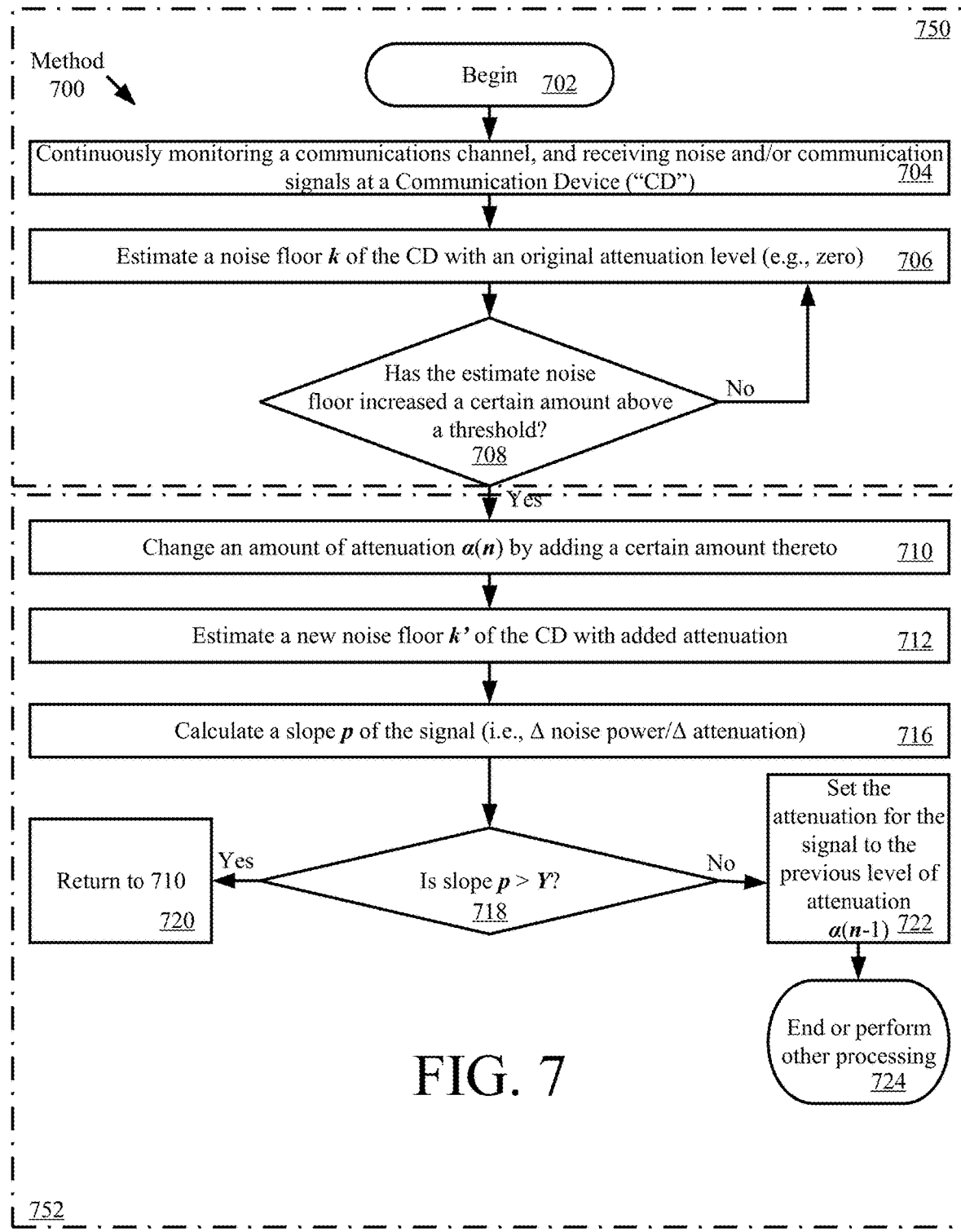
FIG. 7 is a flow diagram of a method for mitigating LTE interference.

Referring now to FIG. 7, there is provided an illustrative method 700 for mitigating LTE interference. Method 700 includes operations 702-724 to determine when a communication device is in an environment where the performance is limited by IM products and not thermal noise regardless of what the measured on-channel and adjacent channel powers are. This determination is made based on an estimate noise floor of the communication device's receiver. Notably, operations in box 750 are performed to detect when there is a high level of interference. Operations in box 752 are performed to determine if the inference is due to IM and to change the attenuation to the optimal level to mitigate the IM. All or some of the operations 702-724 can be performed by a communication transceiver (e.g., LMR communication transceiver 202 of FIG. 2) and/or a processor (e.g., processor 204 of FIG. 2) of a communication device (e.g., communication device 102-106 of FIG. 1, or communication device 200 of FIG. 2).

As shown in FIG. 7, method 700 begins with 702 and continues with 704 where a communication device (e.g., communication device 104 or 106 of FIG. 1) performs operations to continuously monitor a communications channel. Methods for monitoring communications channels are well known in the art, and therefore will not be described herein. The communication device also receives noise signals and/or communications signals in 704. Methods for receiving noise signals and communications signals are well known in the art, and therefore will not be described herein.

Figure 8:
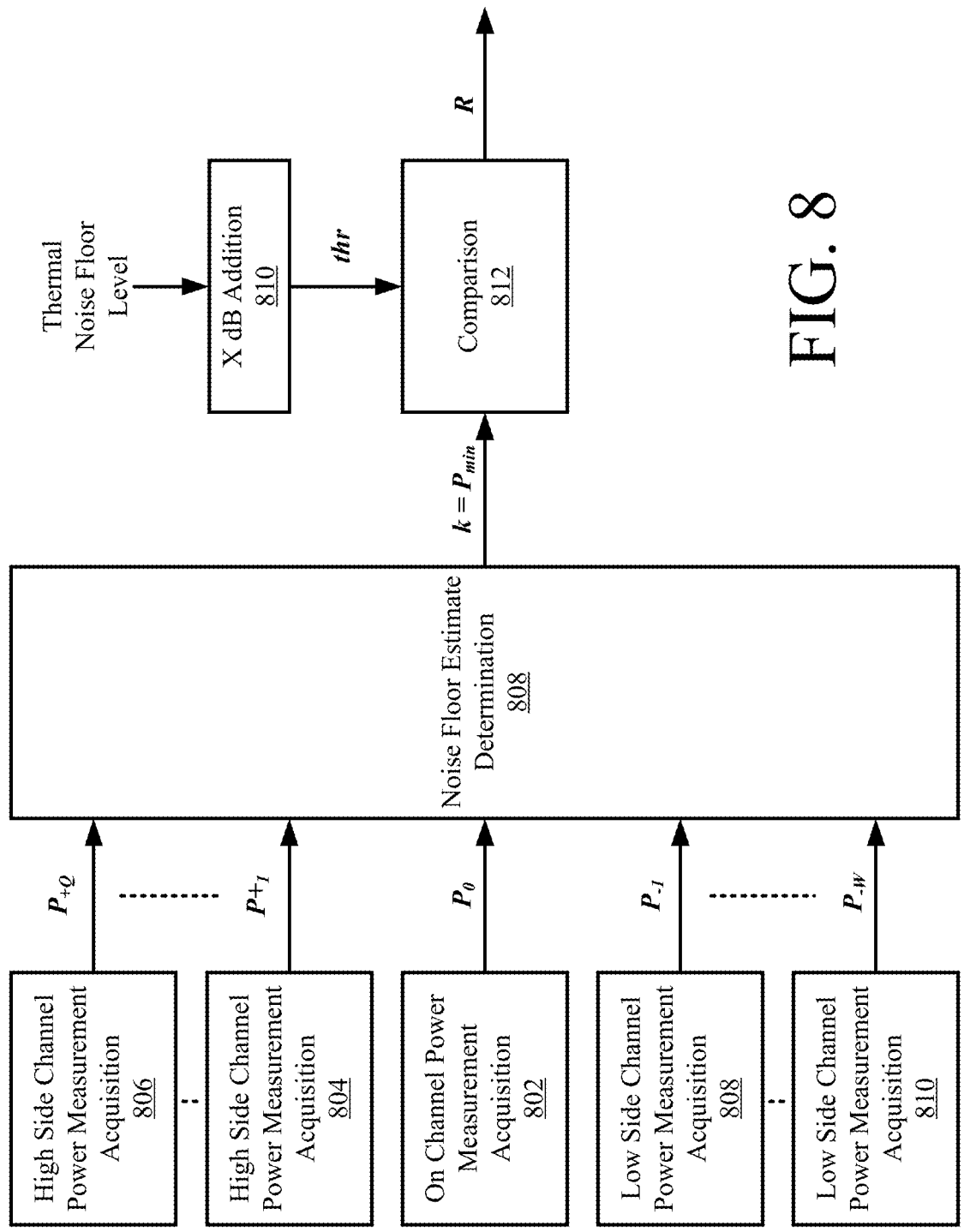
FIG. 8 an illustration that is useful for determining whether an estimate noise floor exceeds a threshold value.

Next in 706, the communication device estimates a noise floor k with an original attenuation level (e.g., zero) being applied by a variable attenuator (e.g., variable attenuator 302 of FIG. 3) of the communication device's receiver (e.g., receiver 300 of FIG. 3). The noise floor estimation is achieved in accordance with a process shown in FIG. 8. As shown in FIG. 8, the process begins by acquiring a measurement of an on channel power $P_0$ in 802, at least one measurement of a high side channel power $P_{+1}, \ldots, P_{+Q}$ as shown by 804-806, and at least one measurement of a low side channel power $P_{-1}, \ldots, P_{-W}$ as shown by 808-810. Q and W are any integer values. Q and W can have the same or different value. Techniques for acquiring channel power measurements are well known in the art, and therefore will not be described here. The power measurements are then used in 808 to determine a noise floor estimate k. The noise floor estimate k may by example be set equal to the minimum acquired power measurement value $P_{min}$. Next, the noise floor estimate k is compared to a threshold value thr in 812. The threshold value thr is equal to a thermal noise floor level (which depends on the channel bandwidth the noise measurement is performed over) plus X dB.

Figure 9:
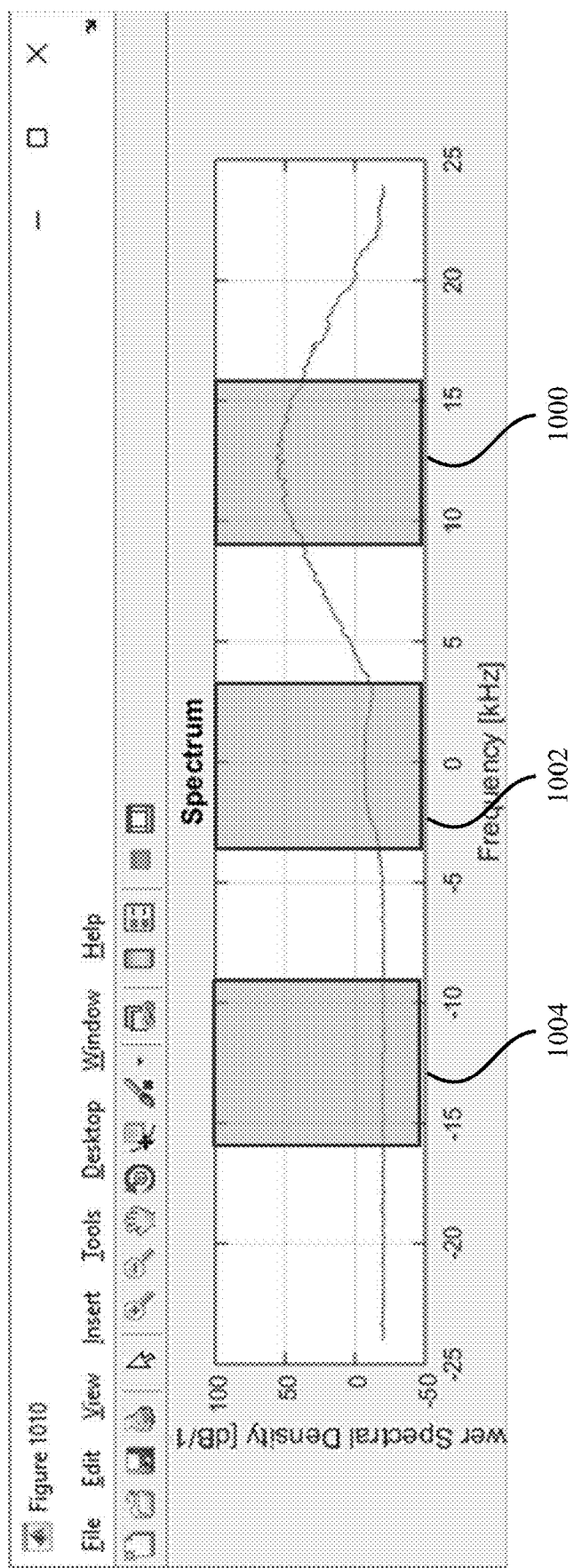
FIGS. 9-10 each provide a graph that is useful for understanding the present solution.

X dB is selected based on a given application. The level X is the amount of degradation that is allowed before the attenuation test for the existence of IM is performed and will vary with specific applications and equipment properties Referring now to FIG. 9, a chart is provided that shows that a high side channel in box 900 is an interfering adjacent channel, the on channel in box 902 has a low signal (e.g., due to being far away), and the low channel in box 904 has the smallest power level. In this scenarios, the noise floor estimate k is set equal to the power level of the low channel since it is the minimal power level of the three channels. The present solution is not limited to the particulars of this scenario.

If the noise floor estimate k is greater than the threshold value thr, then an assumption is made that the signal is in a non-linear region of the receiver and is generating IM (e.g., has at least a 3:1 slope). At this time, a test is performed in method 700 to determine if an increased amount of attenuation (e.g., 1 dB) improves the communication device's receiver sensitivity, i.e., whether the noise floor level estimate is decreased more than Y times the amount of the added attenuation.

Referring again to FIG. 7, the result R is used in 708 to determine whether the estimate noise floor k has increased a certain amount above the threshold thr. If not [708: NO], then method 700 returns to 706. If so [708: YES], then method 700 continues with 710.

In 710, an amount of attenuation applied by the variable attenuator (e.g., variable attenuator 302 of FIG. 3) of the communication device's receiver (e.g., receiver 300 of FIG. 3) is changed by a given amount (e.g., >1 dB) to improve the communication device's sensitivity. Typical $3^{rd}$ order IM products have a 3× increase in the noise level for a 1× increase in the signal level. Typical $5^{th}$ order IM products have a 5× increase in the noise level for a 1× increase in the signal level.

Next in 712, a new noise floor level k' of the communication device is estimated with added attenuation. 712 can also involve measuring the difference between the new noise floor level k' and the previous noise floor level k. Upon completing 712, method 700 continues with 716. In 716, a slope p of the signal is calculated. Methods for computing the slope p of the signal are well known in the art, and therefore will not be described herein. Still, it should be understood that the slope p is the change in noise power over the change in attenuation. If the slope p is less than Y [718: YES], then method 700 returns to 706 as shown by 720. If the slope p is greater than Y [718: NO], then an assumption is made that signal degradation is occurring due to the IM effects. Y is an integer (e.g., 1, 2, etc.). Accordingly, 722 is performed where the attenuation is set for the signal to the previous level of attenuation (e.g., α(k−1), i.e., the original attenuation level plus a total amount of added attenuation) to benefit the sensitivity of the receiver. Subsequently, 724 is performed where method 700 ends or other processing is performed (e.g., return to 702).

Figure 10:
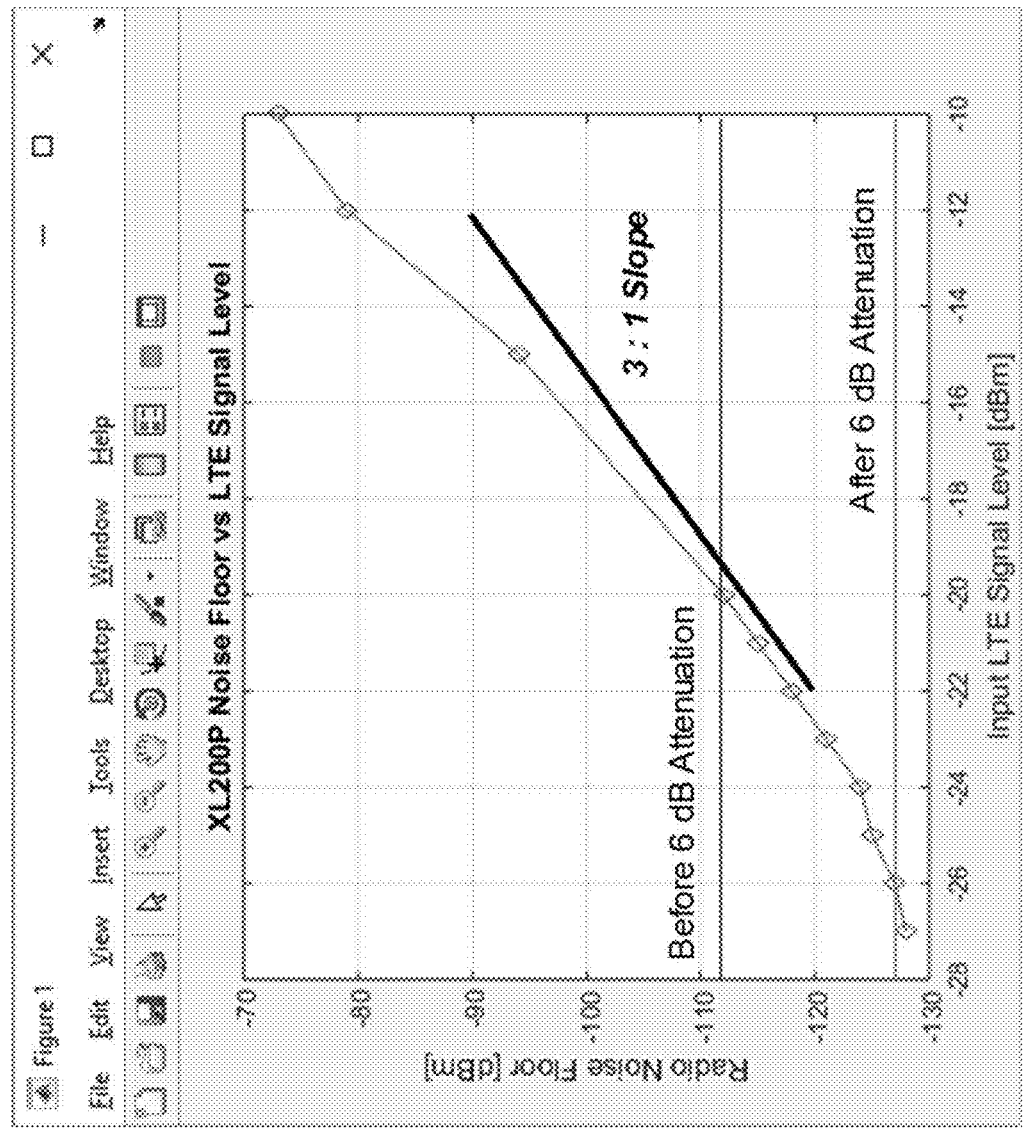

Referring now to FIG. 10, there is a graph showing results from operating an LMR receiver in accordance with the above described method for mitigating LTE interference. As can be seen in FIG. 10, an 18 dB noise floor reduction is provided when 6 dB of attenuation to the LMR receiver's front end. This 18 dB noise floor reduction results in an improvement in the LMR receiver's sensitivity.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for operating a communication device so as to mitigate intermodulation interference to a signal, comprising:

continuously monitoring a plurality of communication channels by the communication device;

using a noise floor level estimate of the communication device to detect when the communication device is under an influence of high interference;

determining an optimal level of attenuation to be applied by a variable attenuator of the communication device's receiver so as to mitigate the influence of intermodulation interference doe to an interference signal; and selectively adjusting an amount of attenuation being applied by the variable attenuator to achieve the optimal level of attenuation;

wherein the optimal level of attenuation is determined by:
performing attenuation adding operations by the variable attenuator to iteratively add an incremental amount of attenuation; and measuring a noise level difference between a noise level of a current iteration of the attenuation adding operations and a noise floor level of a previous iteration of the attenuation adding operations.

2. The method according to claim 1, further comprising estimating the noise floor level with an original attenuation level being applied by the variable attenuator of the communication device's receiver.

3. The method according to claim 2, wherein the noise floor level is estimated by acquiring a power measurement value for an on channel, a power measurement value for at least one high side channel, and a power measurement value for at least one low side channel.

4. The method according to claim 3, where a same or different number of high channel power measurements and low channel power measurements is acquired.

5. The method according to claim 3, wherein the noise floor level is set equal to a minimum value of the power measurement values acquired for the on channel, the at least one high side channel, and the at least one low side channel.

6. The method according to claim 1, wherein a detection as to when the communication device is under an influence of a high level of interference is made based on results from comparing the noise floor level estimate to a threshold value.

7. The method according to claim 6, wherein the threshold value is equal to a known thermal noise floor level plus a certain amount X.

8. The method according to claim 1, wherein the optimal level of attenuation is further determined by:
calculating a slope of the signal, where the slope is defined by the change in noise power over a change in attenuation;
comparing the slope to a threshold value Y; and
considering the optimal level of attenuation to be a previous level of attenuation applied by the variable attenuator when the slope is less than the threshold value Y.

9. A system, comprising:
a processor;
a non-transitory computer-readable storage medium comprising programming instructions that are configured to cause the processor to implement a method for operating a communication device so as to mitigate intermodulation interference to a signal, wherein the programming instructions comprise instructions to:
cause the communication device to continuously monitor a plurality of communication channels;
use a noise floor level estimate of the communication device to detect when the communication device is under an influence of high interference;
determine an optimal level of attenuation to be applied by a variable attenuator of the communication device's receiver so as to mitigate the influence of intermodulation interference due to an interference signal; and
cause an amount of attenuation being applied by the variable attenuator to be selectively adjusted based on the optimal level of attenuation;

wherein the optimal level of attenuation is determined by:
performing attenuation adding operations by the variable attenuator to iteratively add an incremental amount of attenuation; and measuring a noise level difference between a noise level of a current iteration of the attenuation adding operations and a noise floor level of a previous iteration of the attenuation adding operations.

10. The system according to claim 9, wherein the programming instructions comprise instructions to estimate the noise floor level with an original attenuation level being applied by the variable attenuator of the communication device's receiver.

11. The system according to claim 10, wherein the noise floor level is estimated by acquiring a power measurement value for an on channel, a power measurement value for at least one high side channel, and a power measurement value for at least one low side channel.

12. The system according to claim 11, where a same or different number of high channel power measurements and low channel power measurements is acquired.

13. The system according to claim 11, wherein the noise floor level is set equal to a minimum value of the power measurement values acquired for the on channel, the at least one high side channel, and the at least one low side channel.

14. The system according to claim 9, wherein a detection as to when the communication device is under an influence of a high level of interference is made based on results from comparing the noise floor level estimate to a threshold value.

15. The system according to claim 14, wherein the threshold value is equal to a known thermal noise floor level plus a certain amount X.

16. The system according to claim 9, wherein the optimal level of attenuation is further determined by:
calculating a slope of the signal, where the slope is defined by the a change in noise power over a change in attenuation;
comparing the slope to a threshold value Y; and
considering the optimal level of attenuation to be a previous level of attenuation applied by the variable attenuator when the slope is less than the threshold value Y.

* * * * *